(12) United States Patent
Sun et al.

(10) Patent No.: US 9,075,941 B2
(45) Date of Patent: Jul. 7, 2015

(54) METHOD FOR OPTIMIZING ELECTRODEPOSITION PROCESS OF A PLURALITY OF VIAS IN WAFER

(71) Applicant: Hong Kong Applied Science and Technology Research Institute Company Limited, Hong Kong (HK)

(72) Inventors: Yaofeng Sun, Hong Kong (HK); Bin Xie, Hong Kong (HK); Xunqing Shi, Hong Kong (HK); Ou Dong, Hong Kong (HK)

(73) Assignee: Hong Kong Applied Science and Technology Research Institute Company Limited, Hong Kong Science Park, Shatin, New Territories, Hong Kong (CN)

( * ) Notice: Subject to any disclaimer, the term of this patent is extended or adjusted under 35 U.S.C. 154(b) by 18 days.

(21) Appl. No.: 13/894,420

(22) Filed: May 14, 2013

(65) Prior Publication Data
US 2014/0343901 A1    Nov. 20, 2014

(51) Int. Cl.
*G06F 17/50*    (2006.01)

(52) U.S. Cl.
CPC ................... *G06F 17/5009* (2013.01)

(58) Field of Classification Search
None
See application file for complete search history.

(56) References Cited

U.S. PATENT DOCUMENTS

| 5,751,607 | A  | 5/1998  | Ohta         |
| 6,649,521 | B2 | 11/2003 | Kersch et al.|
| 7,189,318 | B2 | 3/2007  | Wilson et al.|
| 7,279,084 | B2 | 10/2007 | Chalupa et al.|
| 7,544,280 | B2 | 6/2009  | Shimizu      |

FOREIGN PATENT DOCUMENTS

| CN | 101572241 A | 11/2009 |
| JP | 11-111717 A | 4/1999  |

OTHER PUBLICATIONS

Strusevich, N.; Patel, M.; Bailey, C., "Parametric modeling study of basic electrodeposition in microvias," Electronic Materials and Packaging (EMAP), 2012 14th International Conference on, vol., No., pp. 1,5, Dec. 13-16, 2012.*

(Continued)

*Primary Examiner* — Omar Fernandez Rivas
*Assistant Examiner* — Bijan Mapar
(74) *Attorney, Agent, or Firm* — Ella Cheong Hong Kong; Sam T. Yip

(57) ABSTRACT

The presently claimed invention provides a method for optimizing an electrodeposition process of a plurality of vias in a wafer. Instead of simulating a large number of via on the wafer for via filling, a representative via is selected with the maximum value of critical factor, which is a function of process parameters. The filling of the representative via is simulated with different sampling points to find out the filling goodness in order to find out the optimized process windows of process parameters. An optimizer is also disclosed, which either provides sampling points or reduces sampling points under artificial neural network method. Calculation of filling goodness is used for evaluating via filling quality and further comparing among via fillings simulated at different sampling points. Consequently, the method of present invention is able to shorten the simulation time for via filling as well as provide a process window with high accuracy.

19 Claims, 12 Drawing Sheets

(56) References Cited

OTHER PUBLICATIONS

Ranganathan, N., et al. "High aspect ratio through-wafer interconnect for three dimensional integrated circuits." Electronic Components and Technology Conference. vol. 55. No. 1. IEEE; 1999, 2005.*

Kaiming He; Rhemann, C.; Rother, C.; Xiaoou Tang; Jian Sun, "A global sampling method for alpha matting," Computer Vision and Pattern Recognition (CVPR), 2011 IEEE Conference on , vol., No., pp. 2049,2056, Jun. 20-25, 2011.*

Beica, R.; Sharbono, C.; Ritzdorf, Tom, "Through silicon via copper electrodeposition for 3D integration," Electronic Components and Technology Conference, 2008. ECTC 2008. 58th , vol., No., pp. 577,583, May 27-30, 2008.*

Haiyong Cao; Huiqin Ling; Kaihe Zou; Ming Li; Dali Mao, "Simulation of electric field uniformity in through silicon via filling," Electronic Packaging Technology & High Density Packaging (ICEPT-HDP), 2010 11th International Conference on , vol., No., pp. 40,44, Aug. 16-19, 2010.* von Gutfeld, R.J.; Romankiw, L.T.; Acosta, R. E., "Laser-Enhanced Plating and Etching: Mechanisms and Applications," IBM Journal of Research and Development , vol. 26, No. 2, pp. 136,144, Mar. 1982.*

Specht, Donald F., "A general regression neural network," Neural Networks, IEEE Transactions on , vol. 2, No. 6, pp. 568,576, Nov. 1991.*

Kaihe Zou; Huiqin Ling; Qi Li; Haiyong Cao; Xianxian Yu; Ming Li; Dali Mao, "Collaborative effect between additives and current in TSV via filling process," Electronic Packaging Technology & High Density Packaging, 2009. ICEPT-HDP '09. International Conference on , vol., No., pp. 103,106, Aug. 10-13, 2009.*

O. Lühn, C. Van Hoof, W. Ruythooren, J.-P. Celis, Filling of microvia with an aspect ratio of 5 by copper electrodeposition, Electrochimica Acta, vol. 54, Issue 9, Mar. 30, 2009, pp. 2504-2508.*

Wikipedia, "Feature Scaling." Retrieved Mar. 6, 2012. https://web.archive.org/web/20120306143520/http://en.wikipedia.org/wiki/Feature_scaling.*

Terr, David. "Weighted Mean." From MathWorld—A Wolfram Web Resource, created by Eric W. Weisstein. Retrieved Jan. 1, 2012. https://web.archive.org/web/20120102102920/http://mathworld.wolfram.com/WeightedMean.html.*

M Ota, S Izuo, K Nishikawa, Y Fukunaka, E Kusaka, R Ishii, J.R Selman, Measurement of concentration boundary layer thickness development during lithium electrodeposition onto a lithium metal cathode in propylene carbonate, Journal of Electroanalytical Chemistry, vol. 559, Nov. 15, 2003, pp. 175-183.*

Lantelme, F., Berghoute, Y., & Salmi, A. (1994). Cyclic voltammetry at a metallic electrode: application to the reduction of nickel, tantalum and niobium salts in fused electrolytes. Journal of applied electrochemistry, 24(4), 361-367.*

A search report from the State Intellectual Property Office of the People's Republic of China on Sep. 18, 2014.

* cited by examiner

| Sampling Method (Select only one from three) | Uniform Sample | Number of Sampling:<br>For Accelerator concentration: an integer (> 2)<br>For Leveler concentration: an integer (> 2)<br>For Suppressor concentration: an integer (> 2) |
|---|---|---|
| | Latin Hypercube Sample | Number of Sampling Points: an integer |
| | Minimum Distance Sample | Number of Sampling Points: an integer<br>Minimum Distance: a value between 0 and 1<br>Maximum running number of each generation: an integer (optional) |
| Number of Layer (Select only one from two) | Three Layer | No of Neurons in the hidden layer: an integer |
| | Four Layer | No of Neurons in the first hidden layer: an integer<br>No of Neurons in the second hidden layer: an integer |
| Way of Learning | Online learning/ Batch Learning | |
| Parameters | Minimum error/Maximum epoch<br>Learning Rate $\eta$<br>Momentum parameter $\alpha$<br>Initial weight scale | |
| Search range | Lower bound of Accelerator concentration<br>Upper bound of Leveler concentration<br>Lower bound of Suppressor concentration<br>Upper bound of Accelerator concentration<br>Lower bound of Leveler concentration<br>Upper bound of Suppressor concentration | |

FIG. 4

Full Factorial Sampling (121 points)
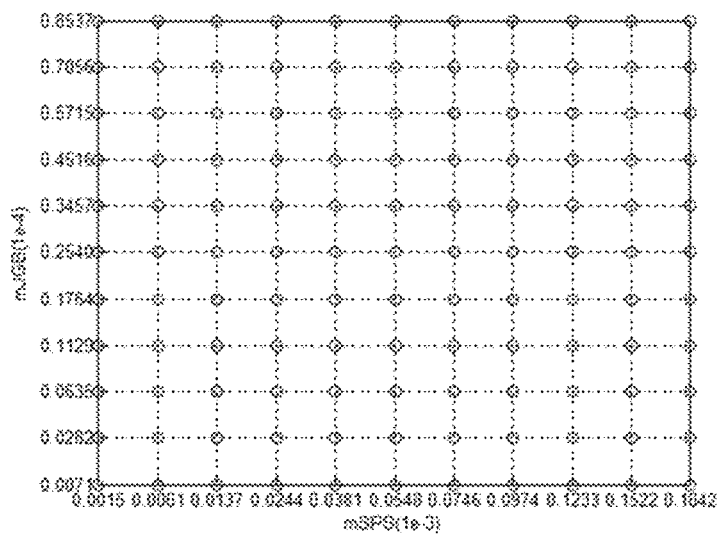
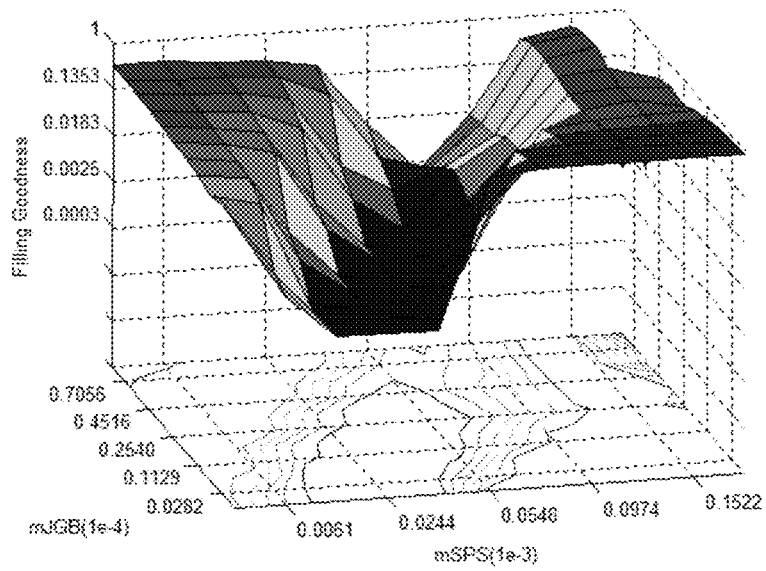
FIG. 5

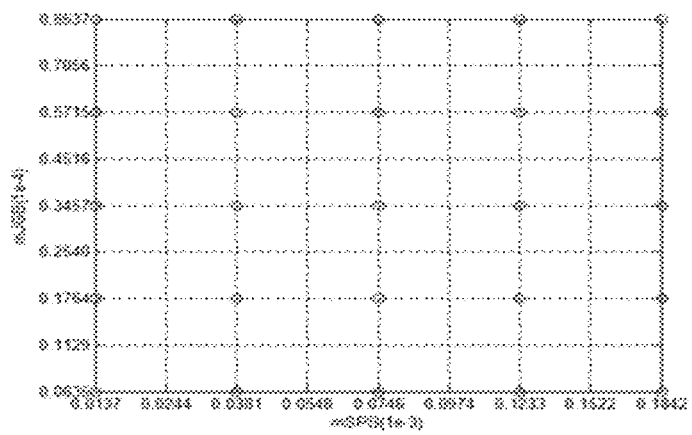
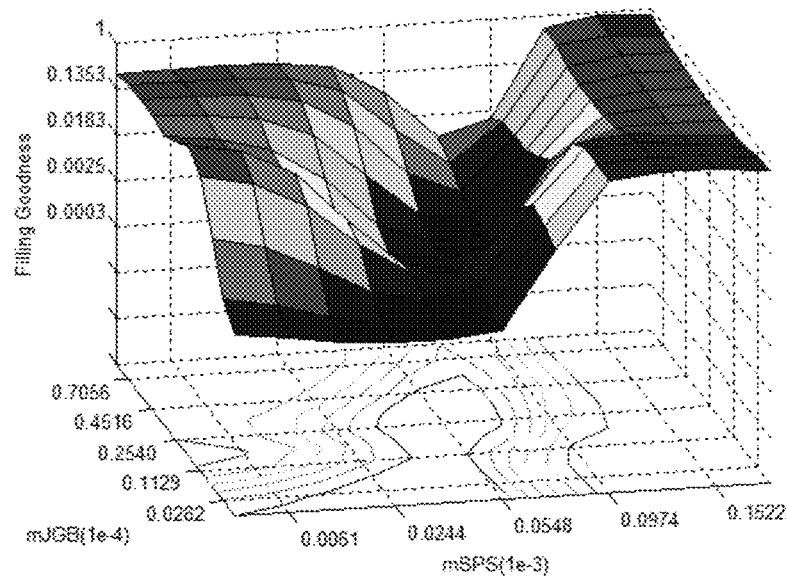
FIG. 6

METHOD FOR OPTIMIZING ELECTRODEPOSITION PROCESS OF A PLURALITY OF VIAS IN WAFER

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

The present invention relates generally to electrodeposition techniques, and more specifically to a method for optimizing an electrodeposition process of a plurality of vias in a wafer.

BACKGROUND

As the design rule for fabricating semiconductors such as LSI has been dramatically reduced in the recent years, a variety of technologies in semiconductor design and manufacturing has been highly developed. On the other hand, the market always creates strong demand for fabricating cheaper, smaller, and lighter electronic products offering better performance and more functionality. The number of electronic device on a single chip is rapidly growing to meet this demand but the ability of two dimensional layouts in circuit design and fabrication to accommodate these demands has reached its limits.

Recently, three-dimensional integrated circuits (3D-ICs) have been providing breakthroughs to this bottleneck. A 3D-IC is a chip in which two or more layers of active electronic components are integrated both vertically and horizontally into a single integrated circuit. This is also referred to as three-dimensional stacking. 3-D wafer stacking represents a wafer level packaging technique in which specific components, such as logic, memory, sensors, A/D converters, controllers, etc., are fabricated on separate wafer platforms and then integrated onto a single wafer-scale or chip-scale package using Through-Silicon Vias (TSVs) to provide the electrical interconnection between the components in the 3-D stack. It provides various advantages such as higher integration, better system performance, lower parasitic losses, and less power consumption. Consequently, many chip designers and manufacturers have shifted to this novel technique.

One of the critical processes for realizing 3D-IC is the fabrication of TSVs. Several techniques have been reported while electrodeposition—the depositing of metal into vias through electroplating process—is frequently applied. Different conductive materials like copper, gold, polysilicon, and tin have been adopted but copper is mostly chosen due to its better electrical conductivity and electromigration resistance.

TSVs have been widely used for forming electrical connections between corresponding layers in stacked or 3D arrangements in devices like memory, MEMS, radio frequency chip, and other semiconductor devices. Nevertheless, vias can easily suffer from defects caused, at least partially, by electroplating pure or near pure metal into the high aspect ratio vias distributed throughout a wafer. The commonly found defects include internal stresses in the metal deposit, non-uniform deposits, inclusions of gases, and excess metal deposition at the inlet and outlet of vias. Severe adverse effects are produced in devices fabricated with these defects.

In general, there are many factors dictating the quality of vias including plating bath or equipment used, via geometry, and additives used. The concentration and type of additives, via shape, aspect ratio (depth/width), and current loading are frequently studied so as to optimize the electrodeposition performance in such complex process. A traditional approach of investigating the abovementioned parameters is through experiments. Experiments can provide solid results but a large number of experiments are usually required. For example, if there are six process parameters to be studied and adjusted in the process, it may induce more than several hundreds of experiments because of the possible permutations of parameters, following by a large of amount of time and cost.

For solving the abovementioned problems, computer simulation is deployed to simulate the electroplating process for determining the suitable process window of process parameters. For example, U.S. Pat. No. 7,279,084 discloses an electroplating method, which uses a computer to generate a model for calculating the current ratio between an inner anode and outer anode. For another example, U.S. Pat. No. 7,544,280 teaches a plating analyzing method for analyzing an electroplating system having an anode, a cathode and plating liquid, based on a Laplace equation discrete by finite volume method for calculating potential distribution. U.S. Pat. No. 7,189,318 also discloses a facility for configuring the electrical parameters in accordance with mathematical model of a processing chamber that corrects for any deficiencies measured during processing.

However, the above prior arts mainly focus on the current and potential used in the electroplating process regarding the wafer plating uniformity but fail to consider via geometry such as via diameter and aspect ratio. Accurate simulation can hardly be achieved without detailed consideration about the geometrical properties of vias and their distribution on wafer. And in general, the accuracy of the computer simulation method as compared against the reality is always a major concern. As a common practice, more consideration factors and more detailed models can be used to enhance the realism of a computer simulation. Nevertheless, the time and computing resources needed for running such computer simulation will increase enormously at the same time, especially given the wafers in the recent years are getting larger and larger in size and the semiconductor devices are being more and more integrated.

Consequently, there is an urgent need to provide a method for optimizing an electrodeposition process of vias through computer simulation with high accuracy while keeping simulation time as short as possible.

SUMMARY

Accordingly, it is a first aspect of the presently claimed invention to provide a method for optimizing an electrodeposition process for a plurality of vias in a wafer that optimizes the process parameters to meet requirements of filling goodness of vias through simulation. A second aspect of presently claimed invention is to provide a method for reducing simulation time in generating an optimized process window of process parameters by selecting a representative via and implementing an artificial neural network method in reducing the number of sampling point.

In accordance to various embodiments, the method of the presently claimed invention comprises the steps of providing first input parameters, simulating wafer electroplating uniformity based on the first input parameters, selecting a representative via, obtaining at least one sampling point by an optimizer, simulating a filling process of the representative via, calculating the filling goodness of the representative via, repeating the simulation with other sampling points obtained by the optimizer following with the calculation of filling goodness until the filling goodness is lower than a predetermined threshold, and generating process window of process parameters.

According to various embodiments of the presently claimed invention, the representative via is the via with the most critical input parameters for achieving good via filling and is selected with a maximum value of critical factor. The critical factor is a function of critical parameters such as flow velocity, diffusion layer thickness, and current density and potential. In general, computational time is too long to simulate all vias. Thus, through simulating via filling with only a representative via, or few representative vias in some cases, the computational time is highly reduced but still keeping accurate simulation result.

According to various embodiments of the presently claimed invention, the filling goodness is defined as a sum of void length and effective seam length divided by via depth. The implementation of filling goodness is effective for quantifying via filling quality for further comparison under different sampling points.

According to various embodiments of the presently claimed invention, the optimizer is to provide the sampling point, which comprises one or more sampling values of the process parameters. Apart from that, the optimizer is driven by an artificial neural network (ANN) method for reducing the number of sampling points, ultimately providing better computation performance in terms of time reduction and accuracy. The ANN method is used to model complex relationships between inputs and outputs or to find patterns in data. For example, the ANN method is able to discover the relationship between the additives' concentrations (input) and the filling goodness (output).

In accordance to one embodiment, the step of simulating the filling process of the representative via comprises the steps of providing second input parameters comprising the current density output from the simulation of wafer electroplating uniformity, simulating plating solution flowing into the representative via, calculating potential-dependent property constants of additives, analyzing distribution of the additives on plating surfaces of the representative via, calculating a local plating current density and its average current density in the representative via, judging whether the average current density is equal to the density output from the simulation of wafer electroplating uniformity, if not, adjusting the plating potential and repeating the steps until that the average current density is equal to the output current density, otherwise advancing plating time, calculating plating thickness, updating a via filling profile, and repeating the above steps until the end of plating time is reached.

In accordance to another embodiment, the step of simulating the filling process of the representative via comprises the steps of providing second input parameters comprising a constant value of applied plating potential, simulating a plating solution flow into the representative via, calculating potential-dependent property constants of additives, analyzing distribution of the additives on plating surfaces of the representative via, calculating a local plating current density, advancing plating time, calculating plating thickness, updating a via filling profile, and repeating the above steps until the end of plating time is reached.

BRIEF DESCRIPTION OF THE DRAWINGS

Embodiments of the present invention are described in more detail hereinafter with reference to the drawings, in which

FIG. 4 shows a table of user inputs for the application of ANN method according to one embodiment of the presently claimed invention;

FIG. 5 shows an optimal region of process window from full sampling with full factorial sampling with 121 points according to one embodiment of the presently claimed invention;

FIG. 6 shows another optimal region of process window from fast sampling with fractional factorial sampling with 25 points according to another embodiment of the presently claimed invention;

DETAILED DESCRIPTION

In the following description, a method for optimizing electrodeposition process of a plurality of vias in wafer is set forth as preferred examples. It will be apparent to those skilled in the art that modifications, including additions and/or substitutions may be made without departing from the scope and spirit of the invention. Specific details may be omitted so as not to obscure the invention; however, the disclosure is written to enable one skilled in the art to practice the teachings herein without undue experimentation.

The presently claimed invention provides a method for optimizing an electrodeposition process of vias that optimizes process parameters to meet the requirements of filling goodness of vias through computational simulation. Particularly, the presently claimed invention is able to reduce simulation time in generating an optimized process window of the process parameters through selecting a representative via, simulating the corresponding via filling, and calculating its filling goodness.

Figure 1:
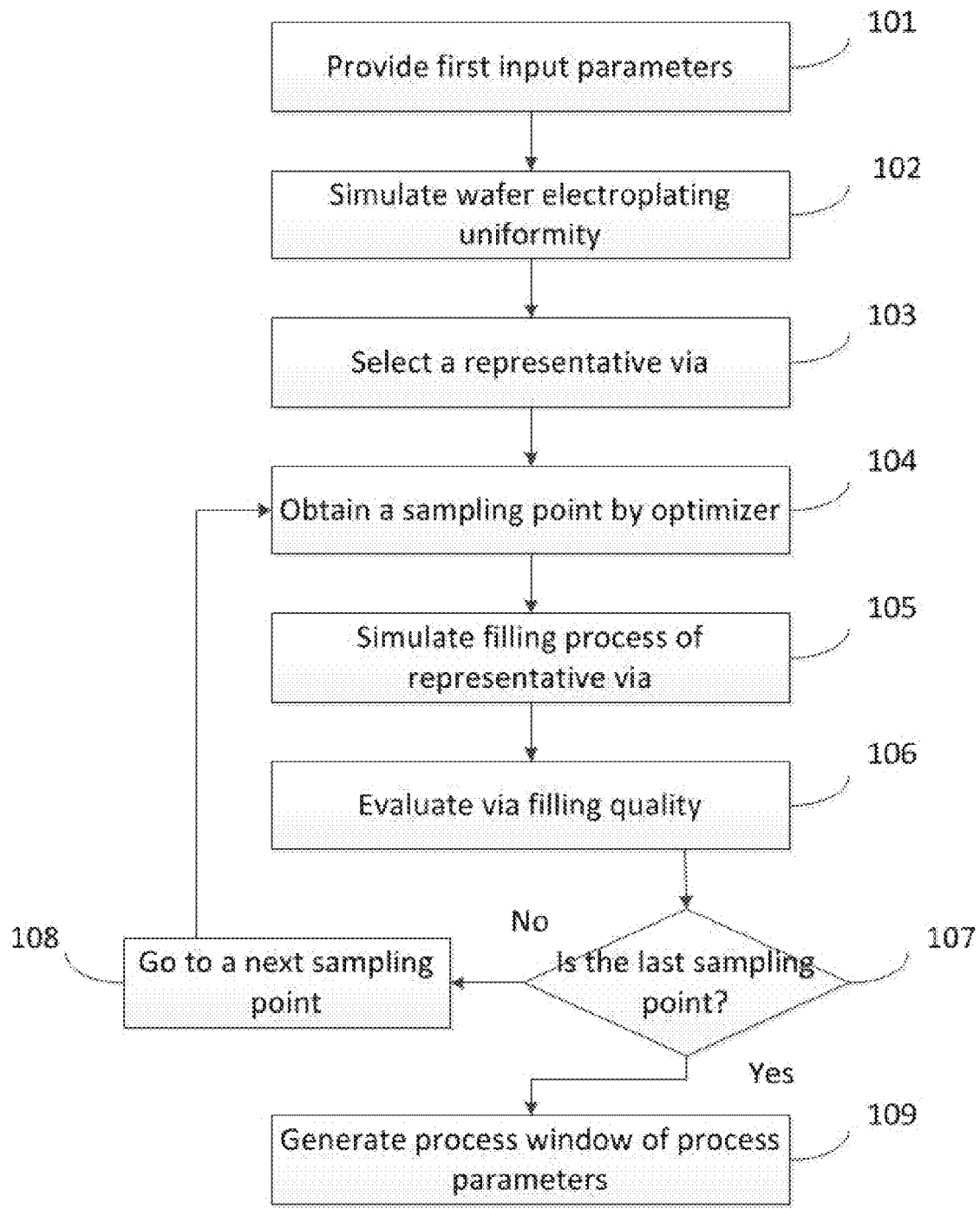
FIG. 1 shows a process flow diagram illustrating the steps of the method for optimizing an electrodeposition process of vias in a wafer according to various embodiments of the presently claimed invention.

FIG. 1 shows a process flow diagram illustrating the steps of the method for optimizing an electrodeposition process of vias in a wafer according to various embodiments of the presently claimed invention. In step 101, first input parameters are input into a computing program for simulation. Then, wafer electroplating uniformity is simulated with the first input parameters to output the output parameters including, but not limited to, flow velocity, diffusion layer thickness, and current density, and potential distribution in step 102. In step 103, a representative via is selected. In step 104, an optimizer provides a least one sampling point, which comprises one or more sampling values of process parameters. In step 105, filling of the representative via is simulated by the computing program. In step 106, via filling quality of the representative via is evaluated to determine whether the one or more sampling values are optimal. Next, the computing program checks whether the sampling point is the last sampling point in step 107. If it is not the last sampling point, the computing program goes to a next sampling point in step 108 and repeats the steps from step 104 to step 107; otherwise, the computing program generates a process window of the process parameters in step 109.

In step 101, the first input parameters include, but not limited to, wafer diameter, via diameter, via depth, applied current density or electrode potential, equilibrium potential, electrolyte conductivity, electrolyte temperature, cathodic charge transfer coefficient, work piece velocity, bulk cupric concentration, cupric diffusion coefficient, electrodeposition duration, bulk concentrations of suppressor, accelerator, and leveler, and property constants of accelerator, leveler, and suppressor.

Regarding step 102, the wafer electroplating uniformity is simulated by governing equations including the Nernst-Plank equation, electroneutrality and Navier-Stokes equation.

The species transport such as for copper ion is calculated by the Nernst-Planck equation shown as follows:

$$\frac{\partial C_j}{\partial t} = \nabla(D_j \nabla C_j) + z_j F \nabla(U_j C_j \nabla \Phi) + V \nabla C_j$$

where $C_j$ is the concentration of species j, $D_j$ is the diffusion coefficient of species j, $z_j$ is the valence of ionic species j, F is the Faraday's constant, $U_j$ is ionic mobility, $\Phi$ is the potential field and V is the fluid velocity vector.

The electroneutrality is calculated as below:

$$\sum z_j C_j = 0$$

The boundary conditions for the electroneutrality are shown as following: At insulation surface:

$i=0$

At electrode surface:

$i=-k\nabla\phi$ where i is the current density, k is the electrical conductivity of electrolyte and $\phi$ is the electric potential.

The Navier-Stokes Equation is for fluid-flow-momentum balance which is calculated as follows:

$$\rho\left(\frac{\partial V}{\partial t} + V \cdot \nabla V\right) = -\nabla P + \mu \nabla^2 V$$

where $\rho$ is the fluid density, V is the fluid velocity, P is the pressure and $\mu$ is the dynamic viscosity.

After the wafer electroplating uniformity simulation, several output parameters are generated including, but not limited to, current density and potential distribution, diffusion layer thickness and flow velocity.

The representative via selected in step 103 is the via being the most critical for achieving good via filling. Preferably, the representative via is selected with the maximum value of critical factor (CF). However, one or more representative vias based on various values of the critical factor can be chosen. The critical factor is a function of critical parameters governing the difficulty in achieving good via filling. Evaluating the difficulty in achieving good via filling for each via is based on the critical parameters, which are passed from wafer uniformity simulation to via filling simulation. In general, the critical parameters include, but not limited to, one or more first input parameters and/or one or more output parameters generated from the wafer electroplating uniformity simulation. For example, where three critical parameters are used, they can include, but not limited, to the thickness of concentration boundary layer (CBL) above a via, $\delta$, velocity of flow at edge of CBL of via, $v_{CBL}$ and current density (or potential) at edge of CBL of via, $i_{CBL}$, which are calculated and output from the simulation of wafer electroplating uniformity. The critical factor is then calculated as following:

$$\text{Critical Factor } (CF) = \alpha \cdot \frac{i_{CBL} - i_{CBL}^{min}}{i_{CBL}^{max} - i_{CBL}^{min}} + \beta \cdot \frac{v_{CBL}^{max} - v_{CBL}}{v_{CBL}^{max} - v_{CBL}^{min}} + \gamma \cdot \frac{\delta - \delta^{min}}{\delta^{max} - \delta^{min}}$$

with $$\begin{pmatrix} \alpha + \beta + \gamma = 1 \\ \& 0 \leq CF \leq 1 \end{pmatrix}$$

where $\alpha$, $\beta$, and $\gamma$ are the weight factors.

Generally, a unit wafer may contain ten thousand vias or even more. Accordingly, simulation time is too long to simulate via filling for each via. However, through selecting only one representative via or few representative vias in accordance to the presently claimed invention to simulate via filling for finding out process window, the simulation time is enormously reduced.

In the process of via filling by electrochemical deposition, void appears when deposition rate is faster at the top sidewall than the bottom of via. Moreover, seam appears when the deposition rate at the top sidewall is same as the bottom sidewall. Both void and seam highly deteriorate the conductive performance of via. Thus, eliminating void and seam in via is a main objective of the presently claimed invention.

Figure 2:
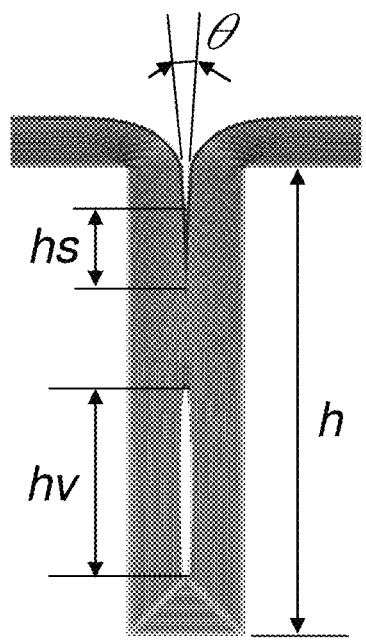
FIG. 2 shows an example of a cross sectional view of a simulated filled via according to the presently claimed invention.

In the simulation of representative via filling in step 105, the evolution of via filling profile with the plating time is tracked through the deposition thickness output from the via filling simulation by moving boundary element method. The lines in the via represent the profiles at different plating time points. A void/seam in the centerline of a via can be detected by calculating the positions of the lines (via profiles at two consecutive plating time points) as shown in FIG. 2, revealing a cross sectional view of a filled via after simulation.

In step 106, via filling quality is quantified by a value of filling goodness (FG), which is effective for comparing via filling quality under different process parameters. FIG. 2 also shows the void length, seam length, filling angle and via depth in the cross sectional view of the filled via. The filling goodness is calculated as follow:

$$FG = \frac{\sum hv + \sum \overline{hs}}{h} \quad FG \in [0,1]$$

where hv is the void length, $\overline{hs}$ is the effective seam length and h is the via depth.

The effective seam length is a function of seam length and filling angle, which is calculated as below:

$$\overline{hs} = \begin{cases} hs * \frac{\cos(\theta) - \cos(\theta_0)}{1 - \cos(\theta_0)} & \text{if } \theta < \theta_0 \\ 0 & \text{otherwise} \end{cases}$$

where $\theta$ is the filling angle and $\theta_0$ is the threshold of filling angle.

As shown by the calculation of the filling goodness, the lower the value of filling goodness, the better the filling goodness is. Lower filling goodness means fewer defects of void and/or seam.

In accordance to various embodiments, the optimizer in step 104 not only provides the sampling points but also has the capability of reducing the number of sampling points through artificial neural network (ANN) method while still ensuring to have suitable number of sampling point for finding out the optimized process window. ANN is a mathematical or computational model that is inspired by the structure and/or functional aspects of biological neural networks to model complex relationships between inputs and outputs or to find patterns in data. In most cases, an ANN is an adaptive system that changes its structure based on external or internal information that flows through the network during the learning phase.

According to one embodiment of the presently claimed invention, the ANN method provides a model for finding out relationship between additives' concentration (input) and filling goodness (output). The additives, frequently used for controlling electrodeposition, include, but not limited to, accelerator, leveler, and suppressor. The suppressor is usually a polyether-based compound, which slows down the electrochemical deposition. The accelerator is usually a sulfur-containing compound, which negates the effect of the suppressor on the electroplating surface. The leveler is usually a quaternary-nitrogen-containing compound, which has a leveling effect for achieving smooth electroplating surface.

Figure 3:
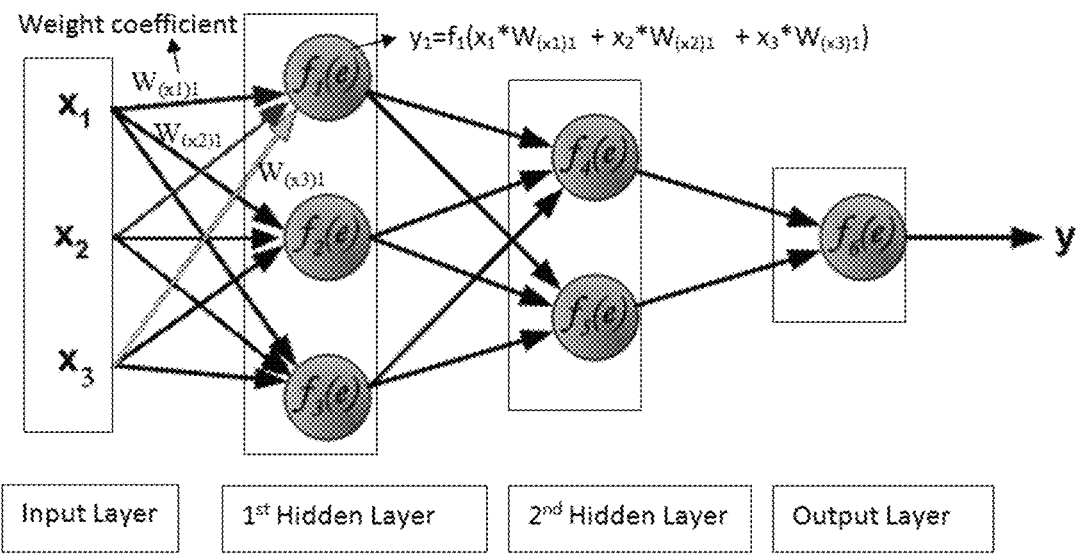
FIG. 3 shows a schematic diagram of an example of artificial neural network method with four-layer network neural according to one embodiment of the presently claimed invention.

FIG. 3 shows a schematic diagram regarding the application of a four-layer neural network according to one embodiment of present invention. The four-layer neural network includes an input layer, a first hidden layer, a second hidden layer and an output layer. The input layer is for receiving the input parameters. In this case, $x_1$, $x_2$, and $x_3$ are the concentrations of accelerator, leveler, and suppressor. The first hidden layer includes three functions $f_1$, $f_2$, and $f_3$, and each of them depends on $x_1$, $x_2$, and $x_3$. Each of the three additive's concentration has a weight coefficient W, corresponding to each function. An example of the function is shown as follows:

$$f(e)=1/(1+\exp(-c*e))$$

where c is a constant and e is a function of additive concentration and weight coefficient.

For an example, e is expressed as follow:

$$e=x_1*W_{(x1)1}+x_2*W_{(x2)1}+x_3*W_{(x3)1}$$

where $W_{(x1)1}$ is the weight coefficient for $f_1$ with $x_1$, $W_{(x1)1}$ is the weight coefficient for $f_1$ with $x_2$ and $W_{(x3)1}$ is the weight coefficient for $f_1$ with $x_3$.

The second hidden layer includes two functions $f_4$ and $f_5$, and each of them depends on the results form functions $f_1$, $f_2$, and $f_3$. The output layer includes one function $f_6$, and it depends on the results from functions $f_4$ and $f_5$. Lastly, the output layer generate the value of filling goodness, y.

User is needed to input the information for the application of ANN method. FIG. 4 shows a table for user inputs regarding the application of ANN method in one embodiment of the presently claimed invention. The inputs from the user include sampling method, number of layer, way of learning, parameters, and search range.

For the sampling method, the user can select uniform sampling, Latin hypercube sampling, or minimum distance sampling. Regarding the uniform sampling, the user input the number of sampling for accelerator, leveler, and suppressor concentration respectively with an integer larger than 2. For the Latin hypercube sampling, the user provides the number of sampling points. For the minimum distance sampling, the user provides the number of sampling points, a value between 0 and 1 for minimum distance, and optionally the maximum running number of each generation.

Regarding the number of layer, the user can select three-layer or four-layer. For the three-layer, the user provides the number of neurons in the hidden layer. For the four-layer, the user provides the number of neurons in the first hidden layer and the number of neurons in the second hidden layer.

Then, for further parameters, the user can provide the values for minimum error/maximum epoch, learning rate η, momentum parameter a and initial weight scale. Lastly, the user provides the search range with an upper boundary and a lower boundary for each of the leveler, the suppressor, and the accelerator concentration.

According to one embodiment, a full factorial sampling with 121 sampling points is needed to calculate the filling goodness in order to find out the optimal region of process window from the full sampling. However, with the ANN method implemented, only fractional factorial sampling with 25 sampling points is needed to acquire the optimal region under such fast sampling. Hence the simulation time is largely reduced.

FIG. 5 shows an optimal region of process window from full sampling with full factorial sampling with 121 sampling points. The x, y, and z-axis corresponds to the accelerator concentration, the leveler concentration, and the filling goodness. FIG. 6 shows another optimal region of process window from fast sampling with fractional factorial sampling with 25 sampling points. By comparing FIG. 5 to FIG. 6, the optimal region of process window from the fast sampling bears a high degree of resemblance to that from the full sampling while fewer sampling points needed.

Figure 7:
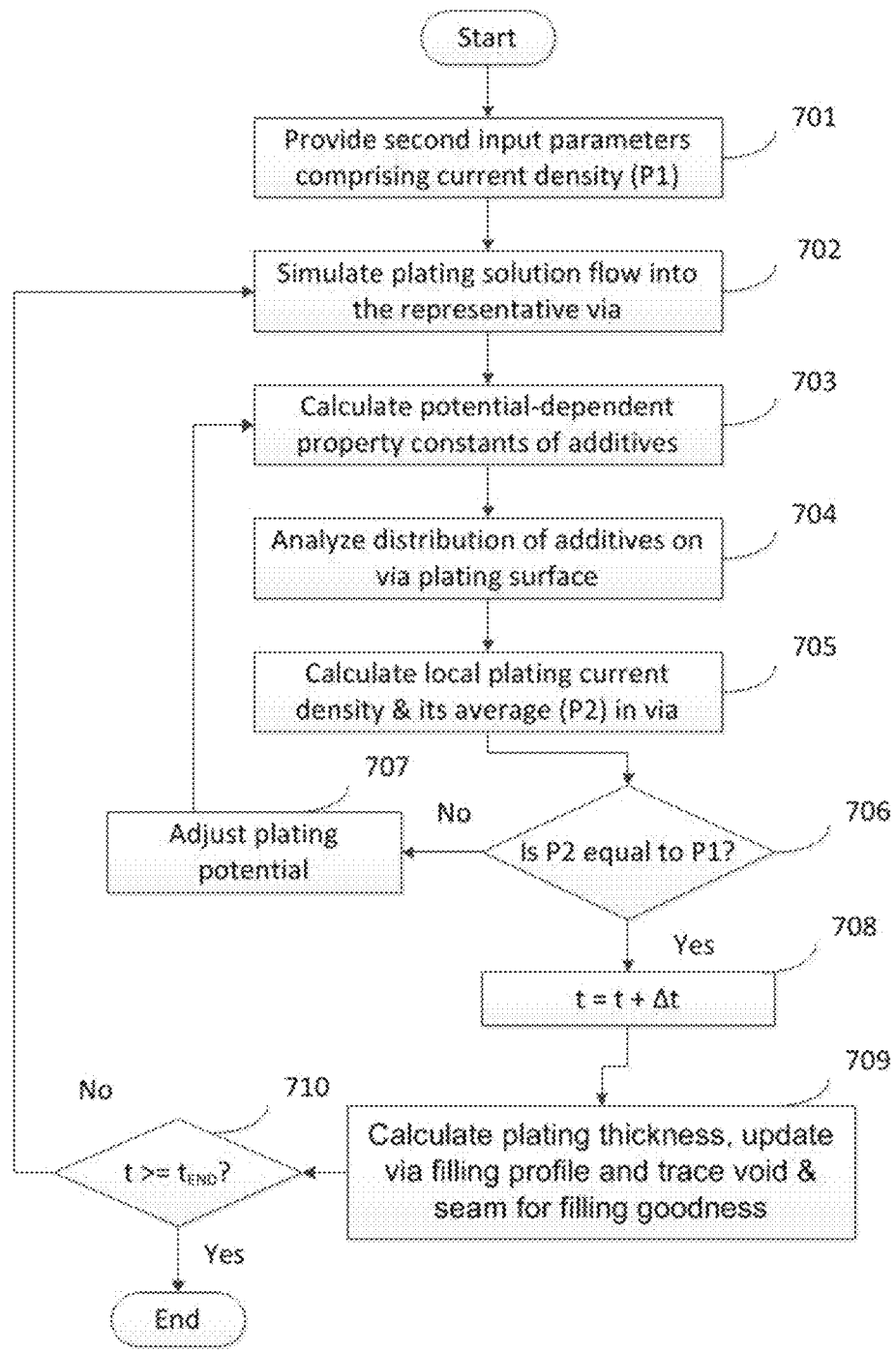
FIG. 7 shows a process flow diagram illustrating the step of simulating representative via filling according to one embodiment of the presently claimed invention.

FIG. 7 shows a process flow diagram illustrating the steps of simulation of the representative via filling of the step 105 under galvanostatic condition with a constant applied current according to one embodiment of the presently claimed invention. After receiving the sampling point from the optimizer, second input parameters are input into the computing program in step 701. The second input parameters in step 701 include, but not limited to, via diameter, via depth, current density distribution, diffusion layer thickness, flow velocity, electrolyte temperature, cathodic charge transfer coefficient, bulk cupric concentration, cupric diffusion coefficient, electrodeposition duration, bulk concentrations of suppressor, accelerator and leveler, and property constants of accelerator, leveler, and suppressor, in which the current density distribution (P1), diffusion layer thickness and flow velocity are the output parameters from step 102.

In step 702, flowing of plating solution into the representative via is simulated. In step 703, potential-dependent property constants of additives are calculated. The additives used can be an accelerator, a leveler, and/or suppressor. Then, distribution analysis of the additives on via plating surface is made in step 704. In step 705, local plating current density in the representative via is calculated following with further calculating its average, P2. When P2 is not equal to P1 as being determined in step 706, step 707 proceeds to adjust plating potential accompanying with further repeating the steps from 703 to 706. Otherwise, plating time is advanced for achieving via filling in step 708. In step 709, plating thickness is calculated with further updating via filling profile and tracing void and seam for the filling goodness. When the plating time is larger than the end of the plating time as being determined in step 710, the via filling quality is evaluated. Otherwise, the steps from 703 to 710 are repeated.

Referring to the simulation of plating solution flow in via in step 702, programming with numerical methods is deployed to solve the fluid velocity field V using Navier-Stokes Moment equation shown as below:

$$\rho(V \cdot \nabla V) = -\nabla P + \mu \nabla^2 V$$

where $\rho$ is the density, $\mu$ is the viscosity and P is the pressure.

Figure 8:
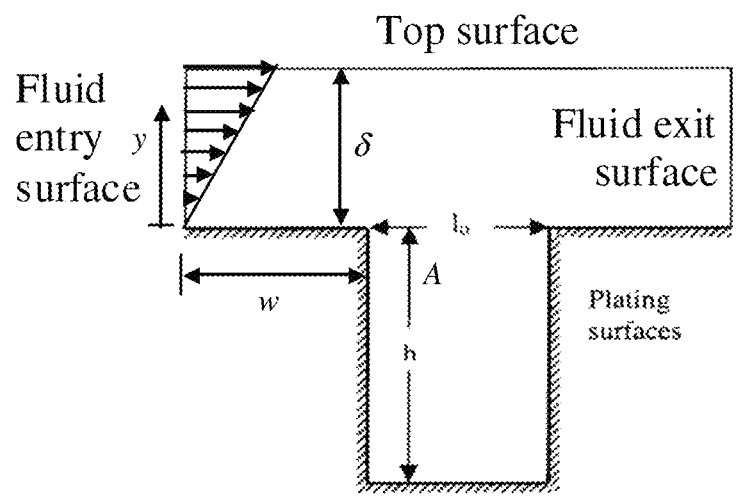
FIG. 8 shows a schematic drawing of trench geometry of a via with an aspect ratio of 2 according to one embodiment of the presently claimed invention.

FIG. 8 shows the trench geometry of a via over domain A with an aspect ratio of 2. The boundary conditions for the Navier-Stokes Moment equation are shown as following:

At top surface:

$$n \cdot V = 0, \tau \cdot V = a\delta$$

At fluid entry surface:

$$n \cdot V = ay, \tau \cdot V = 0$$

At fluid exit surface:

$$\tau \cdot V = 0, 2\mu \frac{\partial V}{\partial n} - P = 0$$

Figure 9:
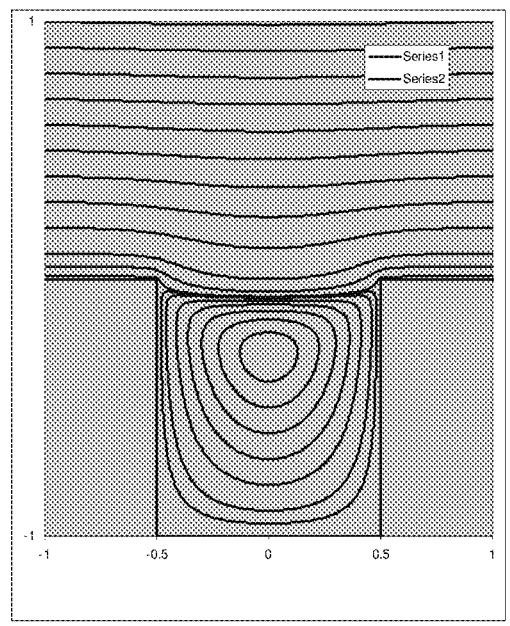
FIG. 9 shows simulated flow streamlines in a via with 100 µm in diameter and 100 µm in depth according to one embodiment of the presently claimed invention.
Figure 10:
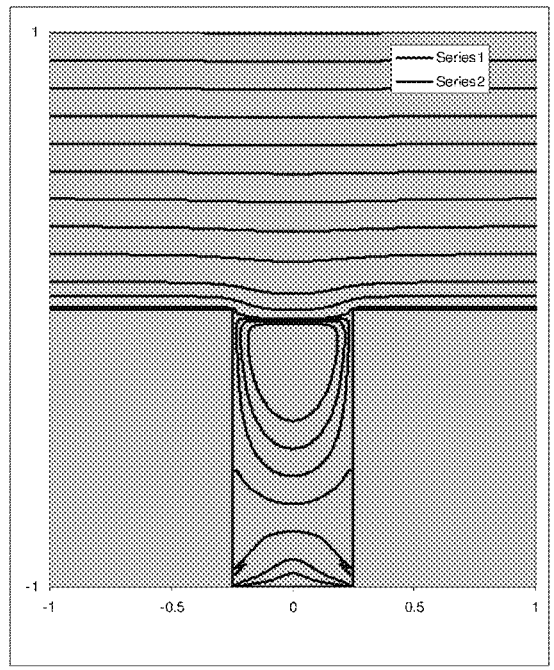
FIG. 10 shows another simulated flow streamlines in another via with 100 µm in diameter and 200 µm in depth according to another embodiment of the presently claimed invention.

At plating surface:

$$V = 0$$

where n is the surface normal, $\tau$ is the surface tangent direction, a is a constant and $\delta$ is the thickness of concentration boundary layer FIG. 9 shows the simulated flow streamlines in a via with 100 μm in diameter and 100 μm in depth. FIG. 10 shows another simulated flow streamlines in another via with 100 μm in diameter and 200 μm in depth.

Figure 11:
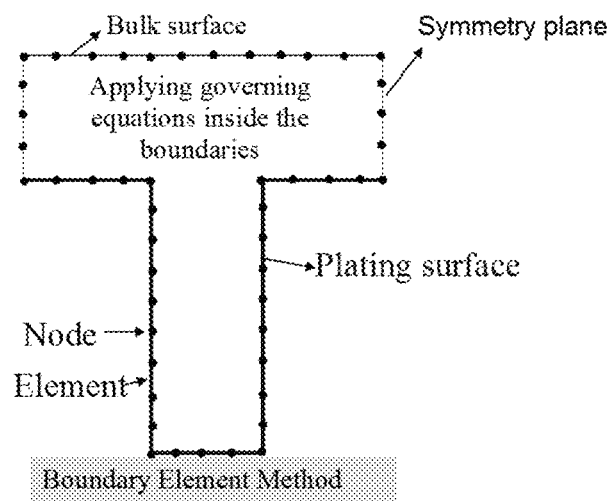
FIG. 11 shows a via analyzed with boundary element method according to one embodiment of the presently claimed invention.
Figure 12:
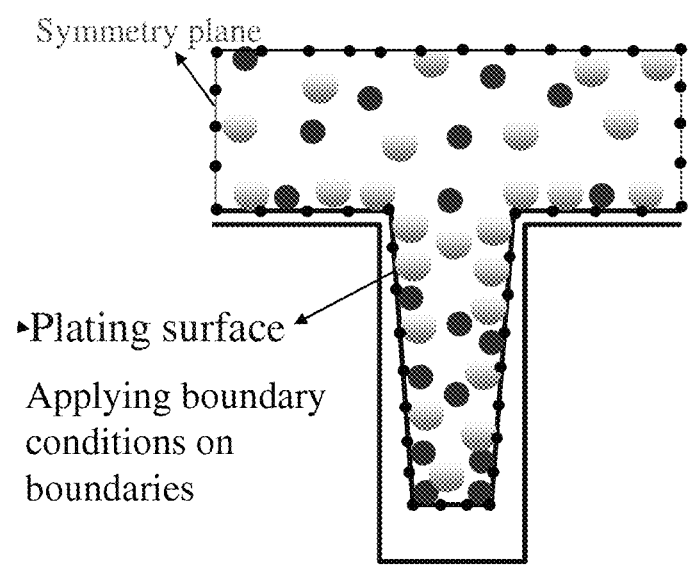
FIG. 12 shows a simulated via filling profile according to one embodiment of the presently claimed invention.

Referring to the distribution analysis of additives on via plating surface in step 704. FIG. 11 shows a via being analyzed with boundary element method in accordance to one embodiment. The via plating surface contains node elements. A bulk surface is on the top of the via, in which the bulk surface is regarded as symmetry plane. Through applying governing equations inside the boundaries and applying boundary conditions on the boundaries on plating surface, the via filling profile is simulated as shown in FIG. 12.

The governing equations and boundary conditions on boundaries are shown as below.

The deposition thickness, S is governed by:

$$\frac{dS}{dt} = \frac{M_w}{\rho} \frac{i}{nF}$$

where $M_w$ is the molecular weight of metal, $\rho$ is the mass density of metal, i is the local density, n is the valence of metal ion and F is the Faraday's constant.

The local current distribution is governed by:

$$i = i_o \frac{C_{ion}^0}{C_{ion}^\infty}(1 - \theta_{eff}) \exp\left(-\frac{\alpha nF}{RT}\eta\right)$$

where $C_{ion}^0$ is the local metal ion concentration, $C_{ion}^\infty$ is the bulk ion concentration, $\theta_{eff}$ is the effective surface coverage, $\alpha$ is the cathodic transfer coefficient, R is the universal gas constant, T is the absolute temperature and $\eta$ is the overpotential.

The mass transport equation is shown as:

$$\frac{\partial C_x}{\partial t} = D_x \nabla^2 C_x + V \nabla C_x$$

where $C_x$ is the concentration of additive x, $D_x$ is the diffusion coefficient of additive x, V is the fluid velocity.

The boundary conditions at plating surface are shown as:

$$\text{additive } x: -D_x \frac{\partial C_x}{\partial n} = k_x \theta_x$$

where $k_x$ is the depletion rate constant of additive and $\theta_x$ is the surface coverage of additive X.

$$\text{copper ion}: -D_{ion} \frac{\partial C_{ion}}{\partial n} = \frac{i}{nF}$$

where $D_{ion}$ is the diffusion of coefficient of ion and $C_{ion}$ is the concentration of ion.

The adsorption and interaction equation is shown as:

$$\frac{d\theta_x}{dt} = K_x^+ C_x(1 - \theta_y) - K_x^- \theta_x + f(C_x, C_y, \theta_y)$$

where $K_x^+$ is the adsorption rate constant of additive x, $K_x^-$ is the desorption rate constant of additive x, $\theta_y$ is the surface coverage of additive y, $C_y$ is the concentration of additive y, and $K_x^+ C_x(1-\theta_y)$, $K_x^- \theta_x$, and $f(C_x, C_y, \theta_y)$ represent the adsorption rate, desorption rate and interaction of additive x and y respectively.

Regarding step 707, adjusting the plating potential is to achieve the average of local via current density, $i_{avg}$, equal to current density at edge of concentration boundary layer, $i_{CBL}$. $i_{CBL}$ is one of the outputs from wafer scale simulation. $i_{avg}$ is calculated as following:

$$i_{avg} = \frac{\int i\, dA}{\int dA} = i_{CBL}$$

where A is the surface area.

The overpotential, $\eta$ is adjusted as follows:

$$\Delta \eta = \frac{\Delta i}{\partial \Delta i / \partial \eta} \text{ with } \Delta i = \frac{\int i\, dA}{\int dA} - i_{CBL}$$

Figure 13:
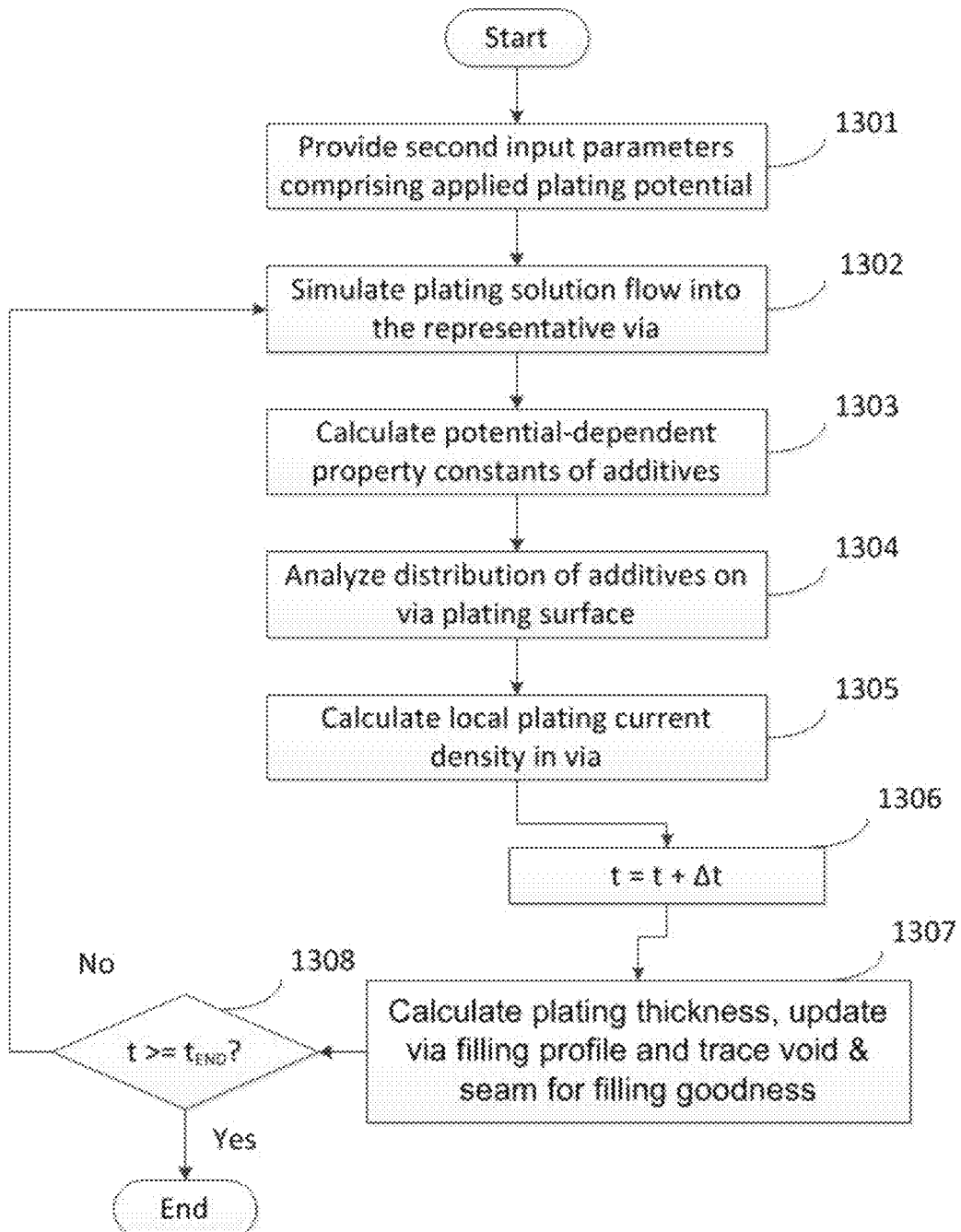
FIG. 13 shows a process flow diagram illustrating the step of simulating representative via filling according to another embodiment of the presently claimed invention.

FIG. 13 shows a process flow diagram illustrating the step of simulation of representative via filling under potentiostatic condition through applying a constant value of plating potential according to another embodiment of the presently claimed invention. After receiving the sampling point from the optimizer, second input parameters are input into the computing program in step 1301. The second input parameters used in this embodiment are similar to the above but further including a constant value of applied plating potential, and etc. In step 1302, flowing of plating solution into the representative of via is simulated. In step 1303, potential-dependent property constants of additives are calculated. The additives used can be an accelerator, a leveler, and/or a suppressor. Then, distribution analysis of the additives on via plating surface is made in step 1304. In step 1305, local plating current density in the representative via is calculated. Plating time is advanced for achieving via filling in step 1306. In step 1307, plating thickness is calculated with further updating via filling profile and tracing void and seam for filling goodness. When plating time reaches the end of the plating time as being determined in step 1308, via filling quality is evaluated. Otherwise, the steps from 1302 to 1308 are repeated.

Figure 14:
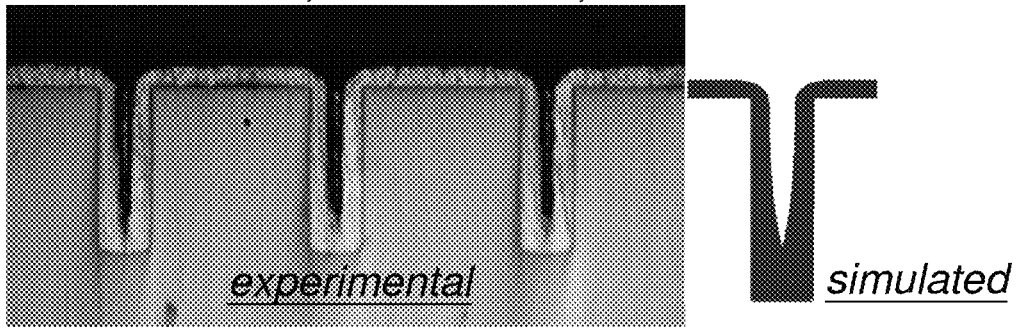
FIG. 14 shows a proof of via filling simulation accuracy between experimental and simulated result according to one embodiment of the presently claimed invention.

In accordance with various embodiments of the present invention, simulation and experimental tests were conducted to prove via filling simulation accuracy between experimental and simulated result. In one experiment, a wafer with 8 inch in diameter was used. In the wafer, there were vias with diameter of 20 μm and depth of 65 μm. The electrolyte used comprised copper sulfate solution with copper ion concentration of 100 g/L, sulphuric acid (98%) of 40 g/L, and chloride of 50 mg/L. The electrolyte also contained additives with accelerator with 1 ml/L, leveler with 7 ml/L and suppressor with 10 ml/L. Accordingly, the ratio of accelerator, leveler and suppressor (A:L:S) concentrations was 1:7:10. Regarding the process parameters, temperature was 25° C., applied current density was 1.0 A/dm², electroplating duration was 55 minutes, and agitation was 50 rotations per minute (rpm). FIG. 14 shows the proof of via filling simulation accuracy between the experimental and simulated results with the above experimental set-up.

Figure 15:
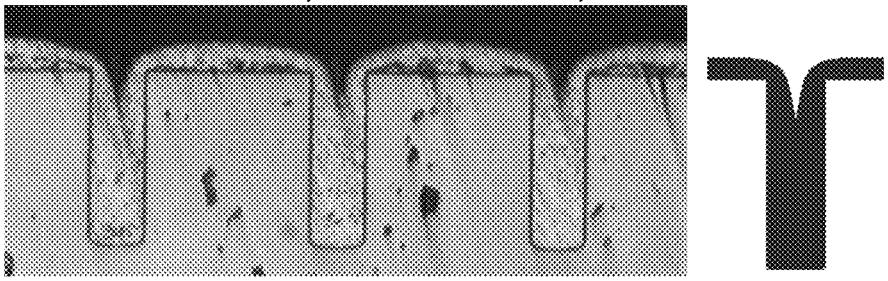
FIG. 15 shows another proof of via filling simulation accuracy between experimental and simulated result according to one embodiment of the presently claimed invention.
Figure 16:
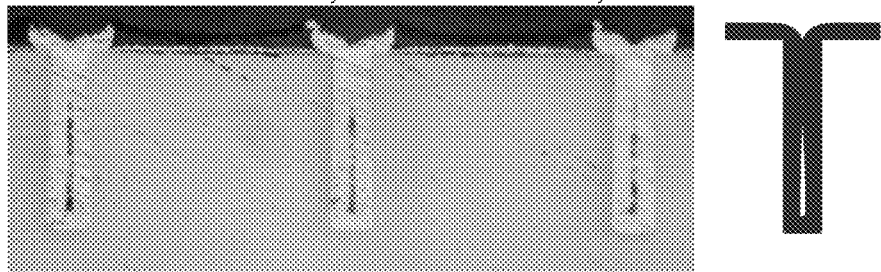
FIG. 16 shows a further proof of via filling simulation accuracy between experimental and simulated result according to one embodiment of the presently claimed invention.

Similar to the aforementioned experimental set-up, FIG. 15 shows another proof of via filling simulation accuracy between experimental and simulated results with via's size being Ø20×65 μm, loading being 1.0 A/dm², and concentration ratio of A:L:S being 3:7:10. FIG. 16 shows yet another proof of via filling simulation accuracy between experimental and simulated results with via's size being Ø50×250 μm, loading being 0.1 A/dm², concentration ratio of A:L:S being 1:2:2 and electroplating duration being 20 hr. From the above three test results, the simulated results are highly similar to the experimental results.

In accordance with various embodiments of the present invention, a simulation was conducted in proof of reasonable process window. The input parameters for the simulation are as follows. The cupric concentration was 110 g/L, cupric diffusion coefficient was 0.000682 mm²/s, electrolyte temperature was 25° C., applied current density was 1.0 A/dm², electroplating duration was 60 minutes, work piece velocity was 50 rpm, via diameter was 20 um, via depth was 80 μm, accordingly, the aspect ratio was 4, and the search range of accelerator, leveler, and suppressor concentration were 0.5 ml/L-6 ml/L, 0.5 ml/L-15 ml/L and 5 ml/L-20 ml/L respectively.

Figure 17:
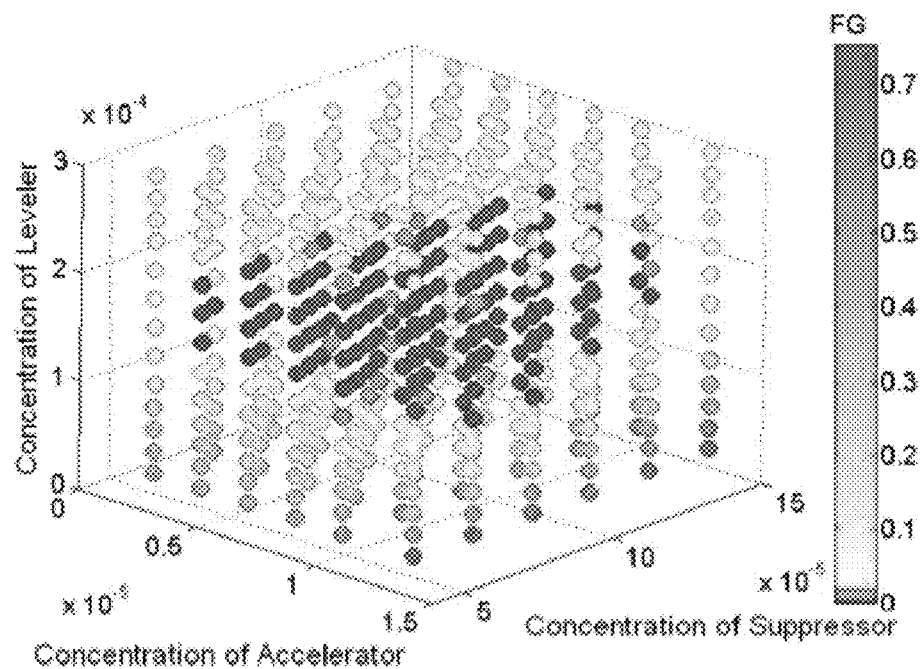
FIG. 17 shows a proof of reasonable process window with a via having an aspect ratio of 4 according to one embodiment of the presently claimed invention.
Figure 18:
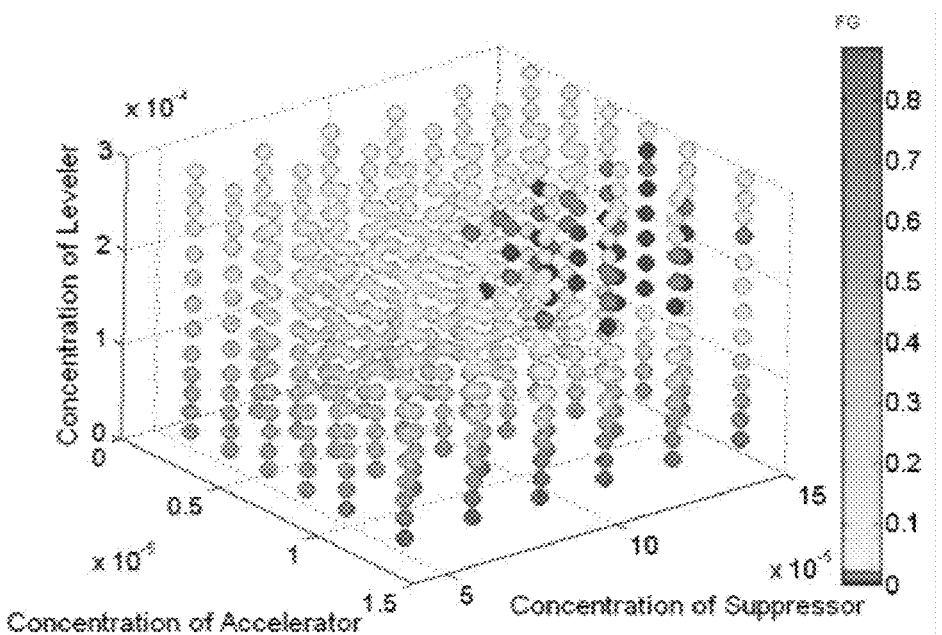
FIG. 18 shows another proof of reasonable process window with a via having an aspect ratio of 5 according to another embodiment of the presently claimed invention.

FIG. 17 shows a three dimensional graph for the proof of reasonable process window. The x, y, and z-axis represent the concentrations of suppressor, accelerator, and leveler respectively. The spheres represent the filling goodness of each sampling point under the simulation. The color of the spheres shows the corresponding filling goodness. Where deeper the color, lower the value of filling goodness is. In the graph, the optimal recipe window is formed at the centre of the graph by the configurations of three additive concentrations with low filling goodness. FIG. 18 shows another three dimensional graph for the proof of reasonable process window with via's size being Ø20×100 μm with an aspect ratio of 5. From the graph, a smaller optimal recipe window locating on the left middle side of the graph is found.

Through the method of presently claimed invention, the time for simulating electrodeposition of vias is highly reduced, the process window of process parameters with high accuracy is also obtained.

The embodiments disclosed herein may be implemented using a general purpose or specialized computing device, computer processor, or electronic circuitry including but not limited to a digital signal processor (DSP), application specific integrated circuit (ASIC), a field programmable gate array (FPGA), and other programmable logic device configured or programmed according to the teachings of the present disclosure. Computer instructions or software codes running in the general purpose or specialized computing device, computer processor, or programmable logic device can readily be prepared by practitioners skilled in the software or electronic art based on the teachings of the present disclosure.

In some embodiments, the present invention includes a computer storage medium having computer instructions or software codes stored therein which can be used to program a computer or microprocessor to perform any of the processes of the present invention. The storage medium can include, but is not limited to, floppy disks, optical discs, Blu-ray Disc, DVD, CD-ROMs, and magneto-optical disks, ROMs, RAMs, flash memory devices, or any type of media or device suitable for storing instructions, codes, and/or data.

The foregoing description of the present invention has been provided for the purposes of illustration and description. It is not intended to be exhaustive or to limit the invention to the precise forms disclosed. Many modifications and variations will be apparent to the practitioner skilled in the art.

The embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the following claims and their equivalence.

What is claimed is:

1. A method for optimizing an electrodeposition process of one or more vias, comprising:
    simulating a wafer electroplating uniformity with one or more first input parameters to generate one or more output parameters;
    determining one or more critical parameters governing difficulty in achieving good via filling, wherein the critical parameters comprises the output parameters;
    calculating one or more critical factors for one or more of the vias based on the critical parameters;
    selecting a representative via from the vias for reduction of simulation time based on a value of the critical factor;
    obtaining a sampling point by an optimizer, wherein the sampling point comprises one or more sampling values of one or more process parameters;
    simulating a filling process of the representative via with the sampling point to determine one or more void lengths and/or one or more effective seam lengths appeared within the representative via;
    calculating a filling goodness based on the void lengths and/or the effective seam lengths determined in the simulated filling process;
    repeating the steps from obtaining the sampling point by the optimizer to calculating the filling goodness with other sampling points until all of the sampling points are processed; and
    generating a process window of the process parameters based on the calculated filling goodness;
    wherein the filling goodness (FG) is calculated by below equation:

$$FG = \frac{\sum hv + \sum \overline{hs}}{h} \quad FG \in [0,1]$$

where hv is the void length, $\overline{hs}$ is the effective seam length and h is a via depth.

2. The method of claim 1, wherein the critical parameters further comprise one or more of the first input parameters.

3. The method of claim 1, wherein the representative via is selected with a maximum value of the critical factor.

4. The method of claim 1, wherein the output parameters are a concentration boundary layer thickness ($\delta$), a flow velocity ($v_{CBL}$), and a current density at concentration boundary layer ($i_{CBL}$), and the critical factors are calculated by below equation:

$$\text{Critical Factor } (CF) = \alpha \cdot \frac{i_{CBL} - i_{CBL}^{min}}{i_{CBL}^{max} - i_{CBL}^{min}} + \beta \cdot \frac{v_{CBL}^{max} - v_{CBL}}{v_{CBL}^{max} - v_{CBL}^{min}} + \gamma \cdot \frac{\delta - \delta^{min}}{\delta^{max} - \delta^{min}}$$

with $$\left( \begin{array}{l} \alpha + \beta + \gamma = 1 \\ \& 0 \leq CF \leq 1 \end{array} \right)$$

where $\alpha$, $\beta$, and $\gamma$ are weight factors.

5. The method of claim 1, wherein the optimizer is driven by an artificial neural network (ANN) method to reduce the sampling points.

6. The method of claim 1, wherein the step of simulating the filling process of the representative via comprising:
    providing one or more second input parameters; wherein the second input parameters comprise at least a current density (P1) based on the output parameters;
    simulating plating solution flowing into the representative via;
    calculating potential-dependent property constants of additives based on a plating potential;
    analyzing distribution of the additives on plating surface of the representative via;
    calculating a local plating current density in the representative via following with calculating an average plating current density (P2);
    judging whether (P2) is equal to (P1), if not, adjusting the plating potential and repeating from the step of calculating the potential-dependent property constants to the step of calculating the local and average plating current density;
    advancing plating time;
    updating a via filling profile;
    tracing the void lengths and the effective seam lengths based on the via filling profile; and
    repeating the above steps except the step of providing the one or more second output parameters until the end of the plating time is reached.

7. The method of claim 1, wherein the step of simulating the filling process of the representative via comprising:
    providing one or more second input parameters; wherein the second input parameters comprise at least a constant value of applied plating potential;
    simulating plating solution flowing into the representative via;
    calculating potential-dependent property constants of additives;
    analyzing distribution of the additives on plating surface of the representative via;
    calculating a local plating current density in the representative via;
    advancing plating time;
    updating a via filling profile;
    tracing the void lengths and the effective seam lengths based on the via filling profile; and
    repeating the above steps except the step of providing the one or more second input parameters until the end of the plating time is reached.

8. The method of claim 1, wherein another representation via is further selected based on another value of the critical factor or other representative vias are further selected based on other values of the critical factors in the step of selecting the representative via for simulating the filling process and calculating the filling goodness.

9. A non-transitory computer-readable medium whose contents cause a computing system to perform a method for optimizing an electrodeposition process of one or more vias, comprising:
    simulating a wafer electroplating uniformity with one or more first input parameters to generate one or more output parameters;
    determining one or more critical parameters governing difficulty in achieving good via filling, wherein the critical parameters comprises the output parameters;
    calculating one or more critical factors for one or more of the vias based on the critical parameters;

selecting a representative via from the vias for reduction of simulation time based on a value of the critical factor;

obtaining a sampling point by an optimizer, wherein the sampling point comprises one or more sampling values of one or more process parameters;

simulating a filling process of the representative via with the sampling point to determine one or more void lengths and/or one or more effective seam lengths appeared within the representative via;

calculating a filling goodness based on the void lengths and/or the effective seam lengths determined in the simulated filling process;

repeating the steps from obtaining the sampling point by the optimizer to calculating the filling goodness with other sampling points until all of the sampling points are processed; and generating a process window of the process parameters based on the calculated filling goodness;

wherein the filling goodness (FG) is calculated by below equation:

$$FG = \frac{\sum hv + \sum \overline{hs}}{h} \quad FG \in [0,1]$$

where hv is the void length, $\overline{hs}$ is the effective seam length and h is a via depth.

10. The non-transitory computer-readable medium of claim 9, wherein the critical parameters further comprise one or more of the first input parameters.

11. The non-transitory computer-readable medium of claim 9, wherein the representative via is selected with a maximum value of the critical factor.

12. The non-transitory computer-readable medium of claim 9, the output parameters are a concentration boundary layer thickness ($\delta$), a flow velocity ($V_{CBL}$), and a current density at concentration boundary layer ($i_{CBL}$), and the critical factors are calculated by below equation:

$$\text{Critical Factor } (CF) = \alpha \cdot \frac{i_{CBL} - i_{CBL}^{min}}{i_{CBL}^{max} - i_{CBL}^{min}} + \beta \cdot \frac{v_{CBL}^{max} - v_{CBL}}{v_{CBL}^{max} - v_{CBL}^{min}} + \gamma \cdot \frac{\delta - \delta^{min}}{\delta^{max} - \delta^{min}}$$

with $$\begin{pmatrix} \alpha + \beta + \gamma = 1 \\ \& 0 \leq CF \leq 1 \end{pmatrix}$$

where $\alpha$, $\beta$, and $\gamma$ are weight factors.

13. The non-transitory computer-readable medium of claim 9, wherein the optimizer is driven by an artificial neural network (ANN) method to reduce the sampling points.

14. The non-transitory computer-readable medium of claim 9, wherein the step of simulating the filling process of the representative via comprising:

providing one or more second input parameters; wherein the second input parameters comprise at least a current density (P1) based on the output parameters;

simulating plating solution flowing into the representative via;

calculating potential-dependent property constants of additives based on a plating potential;

analyzing distribution of the additives on plating surface of the representative via;

calculating a local plating current density in the representative via following with calculating an average plating current density (P2);

judging whether (P2) is equal to (P1), if not, adjusting the plating potential and repeating from the step of calculating the potential-dependent property constants to the step of calculating the local and average plating current density;

advancing plating time;

updating a via filling profile;

tracing the void lengths and the effective seam lengths based on the via filling profile; and repeating the above steps except the step of providing the one or more second output parameters until the end of the plating time is reached.

15. The method of claim 1, wherein the first input parameters are selected from the group consisting of a wafer diameter, a via diameter, a via depth, an applied current density or an electrode potential, an equilibrium potential, an electrolyte conductivity, an electrolyte temperature, a cathodic charge transfer coefficient, a work piece velocity, a bulk cupric concentration, a cupric diffusion coefficient, an electrodeposition duration, bulk concentrations of suppressor, accelerator, and leveler, and property constants of accelerator, leveler, and suppressor, and combinations thereof.

16. The method of claim 1, wherein the first output parameters comprise a flow velocity, a diffusion layer thickness, and a potential distribution.

17. The non-transitory computer-readable medium of claim 9, wherein the first input parameters are selected from the group consisting of a wafer diameter, a via diameter, a via depth, an applied current density or an electrode potential, an equilibrium potential, an electrolyte conductivity, an electrolyte temperature, a cathodic charge transfer coefficient, a work piece velocity, a bulk cupric concentration, a cupric diffusion coefficient, an electrodeposition duration, bulk concentrations of suppressor, accelerator, and leveler, and property constants of accelerator, leveler, and suppressor, and combinations thereof.

18. The non-transitory computer-readable medium of claim 9, the first output parameters comprise a flow velocity, a diffusion layer thickness, and a potential distribution.

19. A method for optimizing electrodeposition process of vias, comprising:

providing one or more critical parameters governing difficulty in achieving good via filling;

selecting a representative via based on a value of a critical factor, which is a function of the critical parameters;

obtaining a sampling point by an optimizer, wherein the sampling point comprises one or more sampling values of one or more process parameters;

simulating a filling process of the representative via with the sampling point;

calculating filling goodness of the simulated filling process;

repeating the steps from obtaining the sampling point by the optimizer to calculating the filling goodness of the simulated filling process with other sampling points until all sampling points are processed; and generating a process window of the process parameters based on the calculated filling goodness;

wherein the filling goodness (FG) is calculated by below equation:

$$FG = \frac{\sum hv + \sum \overline{hs}}{h} \quad FG \in [0,1]$$

where hv is a void length appeared within the representative via, $\overline{hs}$ is an effective seam length appeared within the representative via and h is a via depth.

* * * * *